United States Patent
Kleihorst et al.

(10) Patent No.: US 6,615,335 B1
(45) Date of Patent: Sep. 2, 2003

(54) COMPRESSED STORAGE OF INFORMATION

(75) Inventors: Richard Petrus Kleihorst, Eindhoven (NL); Renatus Josephus Van Der Vleuten, Eindhoven (NL); Andre Krijn Nieuwland, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 342 days.

(21) Appl. No.: 09/786,292

(22) PCT Filed: Jun. 28, 2000

(86) PCT No.: PCT/EP00/06042

§ 371 (c)(1),
(2), (4) Date: Mar. 1, 2001

(87) PCT Pub. No.: WO01/03306

PCT Pub. Date: Jan. 11, 2001

(30) Foreign Application Priority Data

Jul. 2, 1999 (EP) .............................................. 99202149

(51) Int. Cl.$^7$ .............................................. G06F 12/00
(52) U.S. Cl. ........................ 711/170; 711/171; 707/101; 708/203; 382/232
(58) Field of Search ................................ 711/170–173; 707/101; 708/203; 382/232–250; 345/418, 582, 587, 552

(56) References Cited

U.S. PATENT DOCUMENTS

| | | | | |
|---|---|---|---|---|
| 6,115,787 A | * | 9/2000 | Obara | 711/113 |
| 6,128,413 A | * | 10/2000 | Benamara | 382/251 |
| 6,275,535 B1 | * | 8/2001 | Bramley et al. | 375/240.25 |

* cited by examiner

*Primary Examiner*—Do Hyun Yoo
*Assistant Examiner*—Nasser Moazzami
(74) *Attorney, Agent, or Firm*—Russell Gross

(57) ABSTRACT

Disclosed is a method of compressing information for storage in a fixed size memory. The data items (D(k)) that constitute the information are divided into pieces (D(s,k)) of decreasing significance. For example, the DCT blocks of an image are hierarchically quantized (3). The memory (5) is organized in corresponding memory layers (501–504). Successive memory layers have a decreasing number of memory locations. Every time a data item is applied to the memory, its less significant data pieces will have to compete with corresponding data pieces of previously stored data items. Depending on its contribution to perceptual image quality, the applied data piece is stored or the stored data piece is kept. Links (511–513, 521–522) are stored in the memory to identify the path along which a data item is stored. Eventually, the image is automatically compressed so as to exactly fit in the memory. FIG. 2.

16 Claims, 6 Drawing Sheets

COMPRESSED STORAGE OF INFORMATION

FIELD OF THE INVENTION

The invention relates to a method and arrangement for storing data items in a memory, comprising the steps of dividing each data item into successive data pieces of decreasing significance, and storing said successive data pieces in respective successive layers of said memory. The invention also relates to a method and arrangement for reading said data items thus stored.

BACKGROUND OF THE INVENTION

A method as defined in the opening paragraph is generally known. For example, bit map images are usually stored in pixel memories which are divided into as many layers or planes as there are bits per pixel, each layer storing the bits of a particular significance.

To save memory costs, information is often subjected to lossy compression prior to storage. Various compression algorithms are known and some of them have meanwhile been standardized for commercial applications. For example, JPEG is an image compression standard, MPEG and H.263 are video compression standards. Images are divided into blocks and subjected to an orthogonal transform such as the discrete cosine transform (DCT). The coefficients of each DCT block are quantized and entropy-encoded. A buffer control circuit regulates the quantization in such a way that a desired channel bit rate is obtained and/or the image (or a sequence of images) can be stored in a memory of a given capacity, for example, an optical disk.

Predictive encoders such as MPEG encoders have one or more frame memories for temporal storage of prediction frames. Usually, the prediction frames are stored uncompressed in pixel memories but there is a trend towards locally compressing and decompressing the prediction images so that the frame memories can be cost-effectively embedded on the same silicon as the encoder itself. An example of such an encoder is disclosed in Applicant's co-pending International Patent Application IB99/00151 (PHN 16.769).

There are thus various reasons to compress information so that it fits in a given fixed size memory. Sophisticated image compression algorithms achieve this by pre-analyzing each image and distributing the quantization errors evenly. However, this requires additional memory, which is exactly what is to be avoided.

OBJECT AND SUMMARY OF THE INVENTION

It is an object of the invention to provide an attractive alternative method of storing data items in a memory.

The method in accordance with the invention employs a memory which has a decreasing number of memory locations in its successive memory layers. When a data piece is applied to a candidate memory location in which a data piece has previously been stored, the perceptual relevance of at least said stored data piece is compared with the perceptual relevance of at least said applied data piece in accordance with a predetermined criterion. If the perceptual relevance of the stored data piece is larger, the applied data piece is not stored in said candidate memory location. If the perceptual relevance of the applied data piece is larger, the stored data piece in the candidate memory location is replaced by the applied data piece, and link data is stored in the memory to link said candidate memory location to the parent memory location in which the higher significant data piece of the same data item is stored.

It is achieved with the invention that, each time a data item is fetched to the chain of memory layers, its data pieces will have to compete with previously stored pieces. As only the "winners" are stored in the memory, the information is automatically compressed and all memory resources are eventually used for storing the perceptually most relevant data pieces. The information is thus automatically compressed to such an extent that it precisely fits in the memory. A bit rate control mechanism and pre-analysis of the information can be dispensed with.

A particular useful application of the invention is compressed storage of prediction images in an embedded memory of hybrid encoders. Each image is divided into blocks and subjected to the discrete cosine transform (DCT). The DCT blocks of the image constitute the data items. They are hierarchically quantized to obtain the data pieces of decreasing significance.

These and further aspects of the invention are apparent from and will be elucidated with reference to the embodiments described hereinafter.

DESCRIPTION OF EMBODIMENTS

Figures 1, 2:
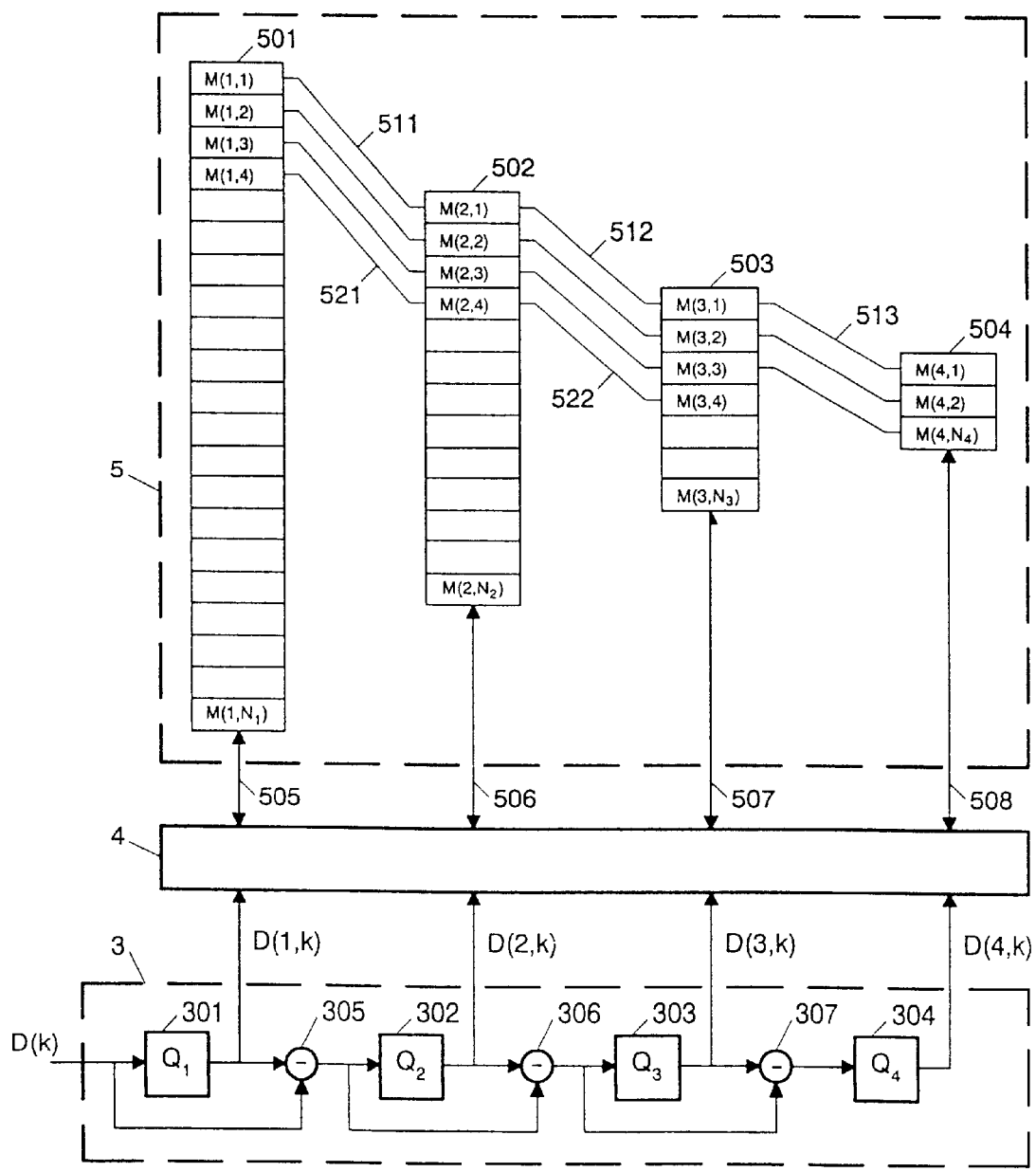
FIG. 1 shows a schematic diagram of an arrangement for storing information in a memory in accordance with the invention.
FIG. 2 shows a more detailed diagram of functional elements that are shown in FIG. 1.

An arrangement for storing an image in a fixed size memory will now be described by way of example. It should be noted, however, that the invention can be applied to virtually any type of information that may be subjected to lossy compression. FIG. 1 shows a schematic diagram of the arrangement. It comprises a circuit 1 for dividing an image I into blocks of, say 8×8 pixels, an orthogonal transform circuit 2 for subjecting each block to a transform, for example, the well-known discrete cosine transform DCT, a quantizing stage 3 for quantizing the blocks D(k) of DCT coefficients, a memory interface circuit 4, and a memory 5. Each DCT block constitutes a data item to be stored in memory 5.

FIG. 2 shows the quantizing stage 3, memory interface circuit 4 and memory 5 in more detail. More particularly, the Figure shows that each DCT block D(k) is subjected to a series of quantizing operations. A first quantizer 301 quantizes the block D(k) into a first code sequence D(1,k) of a predetermined (preferably fixed) number of bits. The code sequence D(1,k) constitutes a data piece having the highest significance. A subtracting circuit 305 subtracts the code sequence D(1,k) from the original DCT block D(k) to obtain the quantization error. This residue is quantized (refined) by a second quantizer 302 which generates a second code sequence D(2,k) having a lower significance than D(1,k). In a similar manner, a third code sequence D(3,k) and a fourth code sequence D(4,k) are generated by a third quantizer 303 and a fourth quantizer 304, respectively. The quantizing stage 3 thus divides each DCT block D(k) into successive code sequences D(s,k) of decreasing significance s.

FIG. 2 further shows that the memory 5 is organized as a series of memory layers. A first memory layer 501 has $N_1$ memory locations M(1,1) ... M(1,$N_1$), a second memory layer 502 has $N_2$ memory locations M(2,1) ... M(2,$N_2$), a third memory layer 503 has $N_3$ memory locations M(3,1) ... M(3,$N_3$), and a fourth memory layer 504 has $N_4$ memory locations M(4,1) ... M(4,$N_4$). As FIG. 2 further shows, successive memory layers have a decreasing number of memory locations, i.e. $N_1 > N_2 > N_3 > N_4$.

There are as many memory layers in memory 5 as there are quantizers in quantizing stage 3. Each memory layer stores code sequences of a corresponding quantizer. That is, each memory location M(s,i) stores a code sequence D(s,k). To this end, each memory layer is connected to the corresponding quantizer via the memory interface circuit 4. The connections 505–508 are bidirectional so that the memory interface circuit can read and write code sequences.

The memory interface circuit 4 is further arranged to establish connection paths in the form of "links" between memory locations of successive layers. If a link between two memory locations M(s,i) and M(s+1,j) is shown in FIG. 2 or similar other Figures, this will mean that these memory locations store code sequences D(s,k) and D(s+1,k), respectively, of the same DCT block D(k). In FIG. 2, the links 511–513 denote that all four code sequences of a particular DCT block are stored in memory 5, viz. in memory locations M(1,1), M(2,1), M(3,1) and M(4,1). The links 521 and 522 denote that only the 3 most significant code sequences of a DCT block are stored in memory locations M(1,4), M(2,4) and M(3,4), because a link to the last (=least significant) layer 504 is missing. Practical embodiments for establishing the links will hereinafter be described in more detail.

Figure 3:
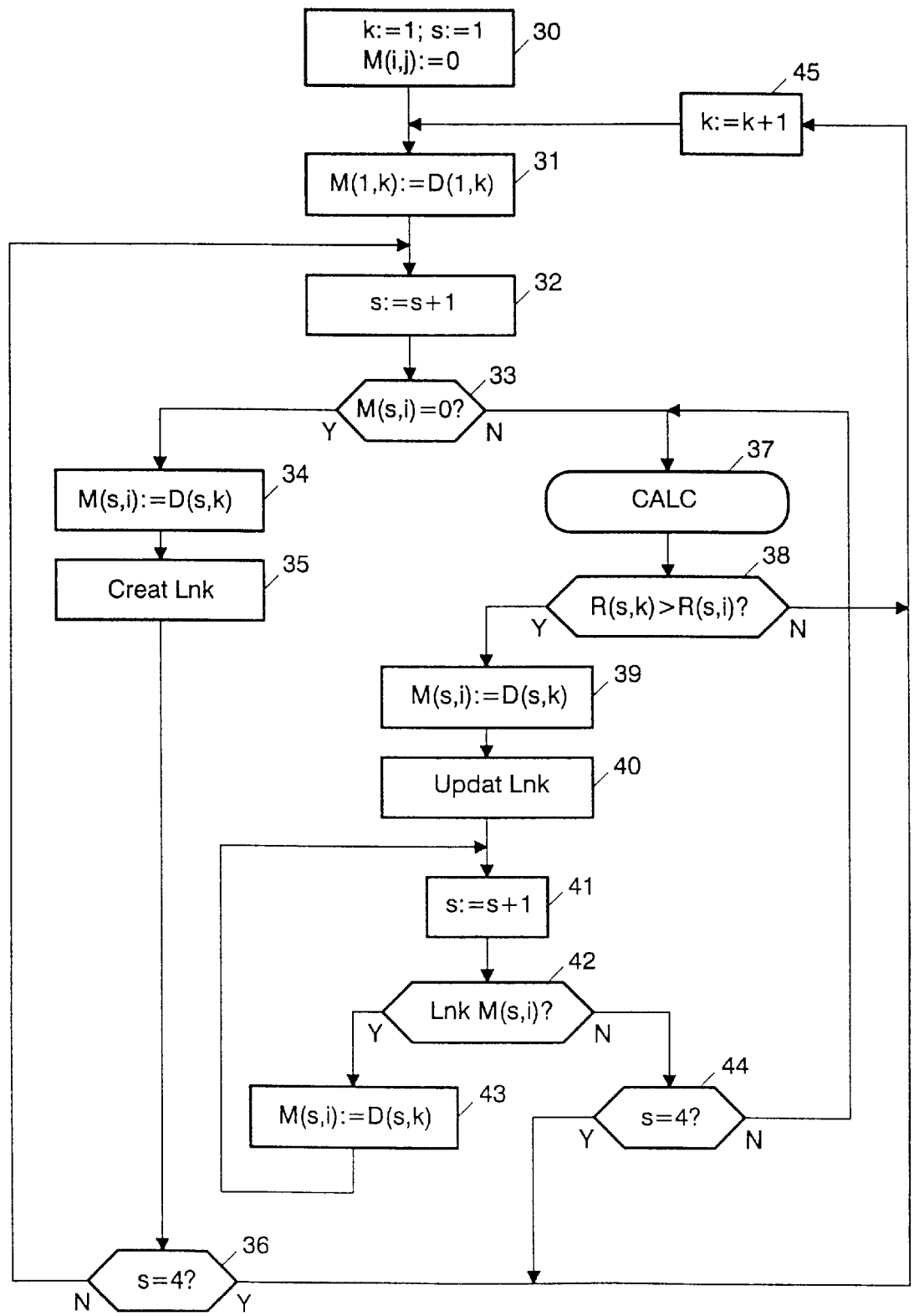
FIG. 3 shows a flow chart of operational steps to illustrate the storage process which is carried out by the arrangement.

The operation of the arrangement shown in FIG. 2 is defined by instructions executed by the memory interface circuit 4. To this end, the interface circuit will have an embedded microprocessor in practice. The memory interface circuit is therefore also referred to as microprocessor. Its operation will now be described with reference to a flow chart of operational steps which is shown in FIG. 3. In an initial step 30, a variable k denoting a current DCT block D(k) is assigned the value 1, and a variable s representing the significance of the current code sequence D(s,k) of said block is assigned the value 1. Note that a larger value of s will represent a lower significance. All memory locations M(i,j) are cleared to indicate that no code sequences have yet been stored therein.

In a step 31, the most significant code sequence D(1,k) of the current DCT block is stored in memory location M(1,k) of the first (=most significant) memory layer. It will here be assumed that the first memory layer has sufficient memory locations to store the most significant code sequences D(1,k) of all DCT blocks of the image.

In a step 32, the variable s is increased by one. In a step 33, it is examined whether a memory location M(s,i), which is qualified for storage of code sequence D(s,k), is empty. Code sequences are stored in a memory layer from top to bottom in this embodiment. The memory location M(s,i) being qualified for storage thus simply is the next memory location of the relevant layer. If the memory location M(s,i) is empty, the code sequence D(s,k) is stored in said location in a step 34. The microprocessor further creates, in a step 35, the link between the memory location M(s,i) and the memory location M(s−1,j) in which the higher significant code sequence of the same DCT block has been stored. It will be provisionally assumed that there are indeed free memory locations in each layer to store the current code sequence D(s,k). In a step 36, it is subsequently examined whether all code sequences of the current DCT block have been processed. If that is not the case, the program returns to the step 32 to process the next (lower significant) code sequence of the same DCT block. Otherwise, the program increments k (step 45) and returns to the step 31 for processing the next DCT block.

After this description of the operation of the memory interface circuit 4, it will be appreciated that as many DCT blocks as there are memory locations in the least significant memory layer can be completely stored in memory 5. The storage process will soon reach a stage in which a current DCT block D(k) can no longer be completely stored due to lack of an empty memory location in one of the memory layers. FIG. 2 shows the situation where this occurs for the first time. The links 521–522 shown in the Figure indicate that the three most significant code sequences of the fourth DCT block D(4) have been stored. The store program has proceeded to the step 33, and found that there is no empty memory location in memory layer 504 to store the least significant code sequence D(4,4) of block D(4).

If it is determined, in the step 33, that there is no longer an empty memory location available in a memory layer, the code sequence D(s,k) must compete with previously stored code sequences. To this end, a calculation sub-program 37 calculates the perceptual relevance R(s,k) of the code sequences D(s,k) ... D(4,k) that have not yet been stored. An indication for the perceptual relevance is the total energy of the 63 AC coefficients $q_n(s,k)$ of the applied code sequence D(s,k) and its less significant successors:

$$R(s, k) = \sum_{s'=s}^{4} \sum_{n=1}^{63} q_n^2(s', k),$$

which may in practice be approached by the energy of the AC coefficients of the applied code sequence D(s,k) only:

$$R(s, k) = \sum_{n=1}^{63} q_n^2(s, k).$$

In a similar manner, the sub-program also calculates the perceptual relevance R(s,i) of one or more previously stored competing code sequences D(s,i). In this embodiment, the sub-program 37 determines the memory location M(s,i) in which the code sequence having the lowest perceptual relevance R(s,i) is stored.

Figure 4A:
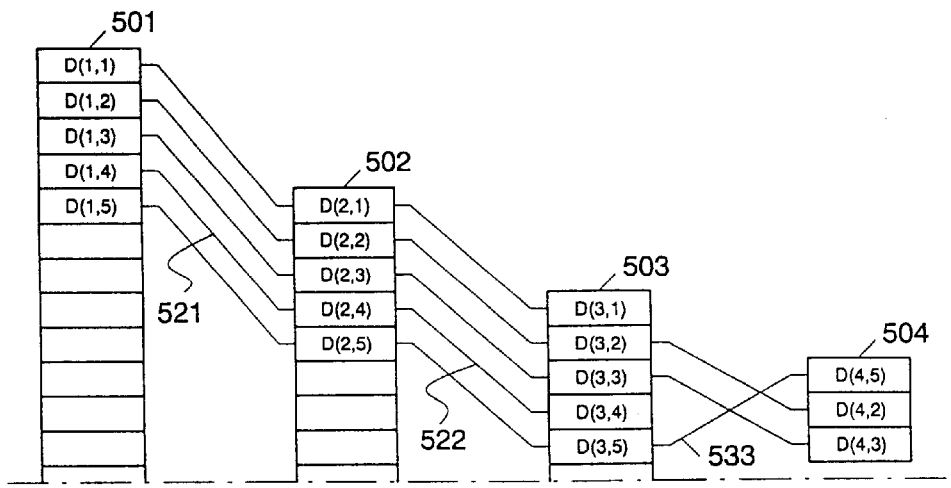
FIGS. 4A–4C show examples of memory contents in various stages of the storage process.

Subsequently, in a step 38, the microprocessor compares R(s,k) with R(s,i). If the current code sequence has a lower perceptual relevance, the program returns to the step 31 to process the next DCT block. Neither the current code sequence nor the less significant code sequences of the same block D(k) are stored in this case. It will here be assumed that code sequence D(4,4) indeed has insufficient perceptual relevance to justify its storage. Accordingly, only the three most significant code sequences of DCT block D(4) are kept for the time being. This situation is shown in FIG. 4A where the path 521,522 is discontinued after the third memory layer.

If the current code sequence D(s,k) has a higher perceptual relevance, a step 39 is performed in which the code sequence is stored in the memory location M(s,i) which held the less relevant code sequence. In a step 40, the links are updated so as to reflect the new situation. That is, the link to the losing parent is broken and a new link is made. This situation is also shown in FIG. 4A. The least significant code sequence of DCT block D(5) is stored in M(4,1), thereby overwriting the previously stored, perceptually less relevant, code sequence D(4,1). The previous link (513 in FIG. 2) is replaced by a new link 533.

Having stored the code sequence D(s,k) in memory location M(s,i), the program proceeds with storing the less significant code sequences of the same block D(k) in those subsequent memory locations that are linked to memory location M(s,i). To this end, the program increments s (step 41), examines whether there is a link to the next layer (step 42), and stores the less significant code sequence in said layer (step 43). The replacement operation is repeated until it is found, in the step 42, that all previously stored code sequences along the existing path have been replaced.

Figure 4B:
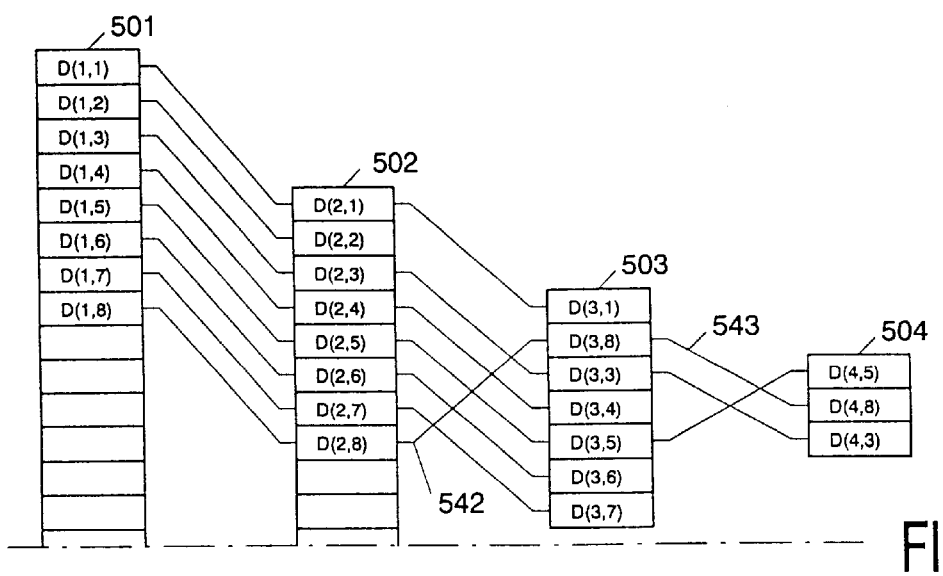

One example of the replacement operation is shown in FIG. 4B where, upon storing sequence D(3,8) in M(3,2) and making the link 542, the less significant sequence D(4,8) of the same block is stored in M(4,2), which was already linked (543) to M(3,2). In this example, the replacement operation had been continued until it was found, in a step 44, that there were no more code sequences of the current block D(k) to process.

Figure 4C:
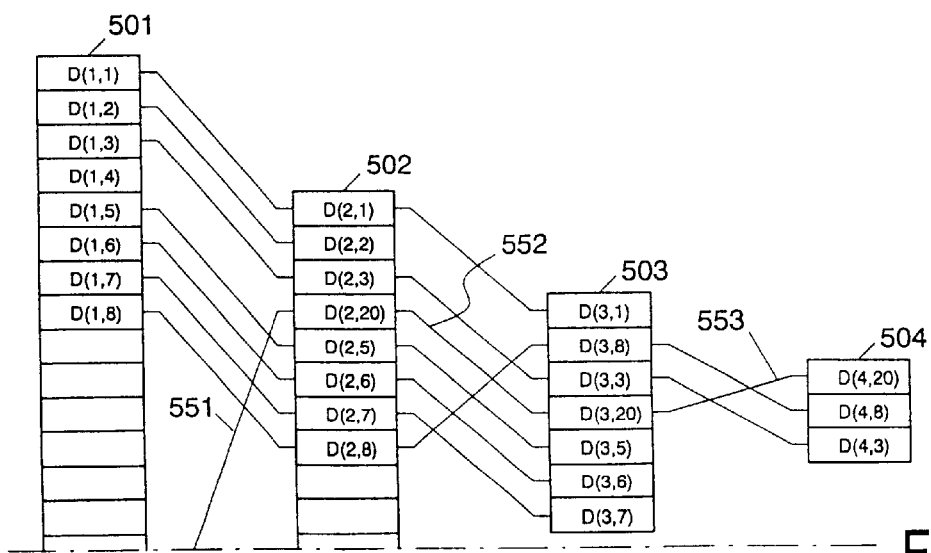

Another example is shown in FIG. 4C where code sequence D(2,20) is stored in M(2,4) (new link 551), and the less significant sequence D(3,20) of the same block is stored in M(3,4) (existing link 552). The storage process now finds, in the step 42, that there are no more existing links from M(3,4) to the next layer (cf. FIG. 4B). In such a case, the calculation sub-program 37 is again executed to evaluate whether the less significant code sequences of D(20) are perceptually more relevant than those already stored. In FIG. 4C, it was found that D(4,20) is more relevant than D(4,5) (cf. FIG. 4B). Accordingly, D(4,20) is stored in M(4,1) and the appropriate link 553 is made.

At the end of this storage process, the image has automatically been compressed to exactly fit in the memory. All memory resources have been used, and the image quality is evenly spread over the whole image.

Figure 5A:
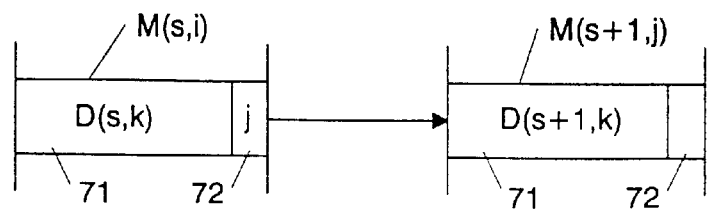
FIGS. 5A and 5B show different embodiments of establishing links between successive memory layers.
Figure 5B:
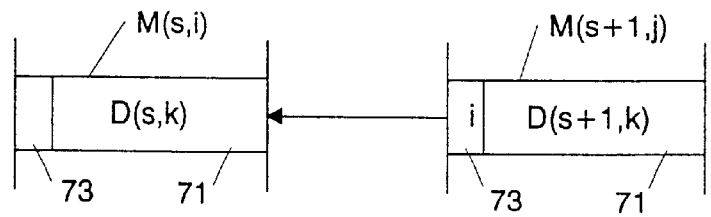

FIGS. 5A and 5B show diagrams to illustrate embodiments of establishing the links between successive memory layers. The Figures show a memory location M(s,i) in memory layer s and a memory location M(s+1,j) in the next (less significant) memory layer s+1. Each memory location comprises a section 71 for storing the code sequence D(s,k) and an address section. In FIG. 5A, an address in address section 72 addresses the memory location j in which the less significant code sequence is stored in the next layer. In FIG. 5B, an address in address section 73 addresses the (parent) memory location i of the previous layer where the more significant code sequence is stored. Assuming that layer s and layer s+1 have $N_s$ and $N_{s+1}$ memory locations, respectively, and taking into account that one address value is to be used for specifying the absence of a link to the next layer, the total number of address bits in FIG. 5A is:

$$N_s \times \lfloor {}^2\log(N_{s+1}+1) \rfloor.$$

In FIG. 5B (where the absence of a link need not be encoded as there is always a parent), the total number of address bits is:

$$N_{s+1} \times \lfloor {}^2\log N_s \rfloor.$$

Figure 6:
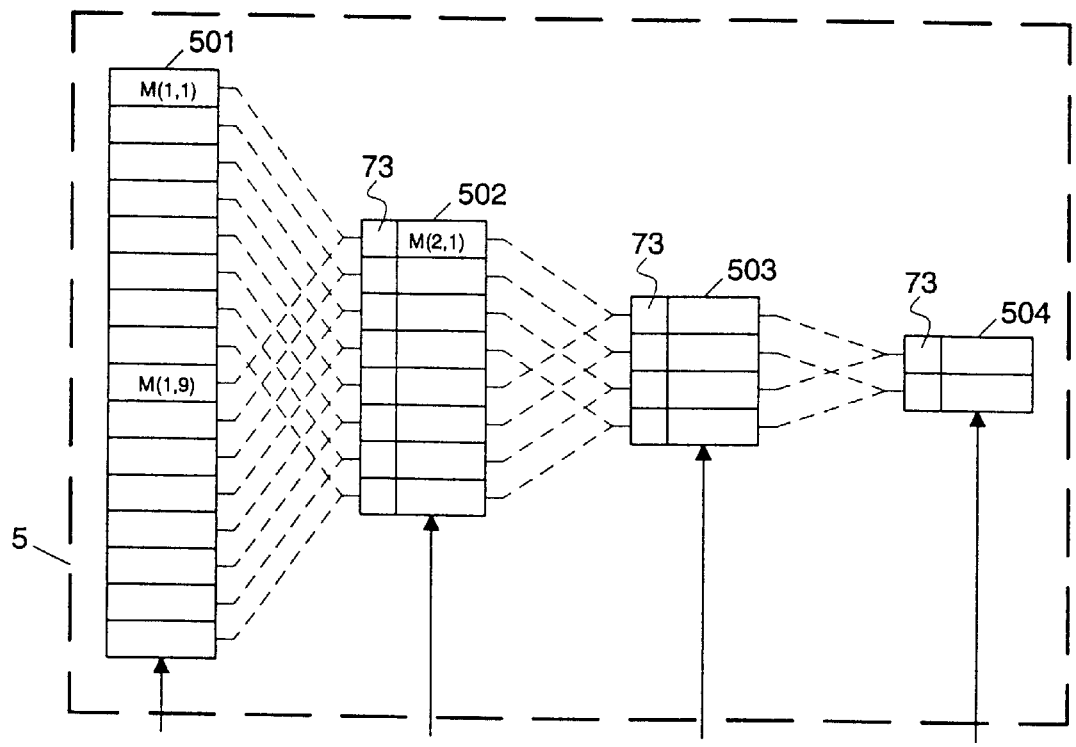
FIG. 6 shows an alternative embodiment of the memory which is shown in FIG. 2.

The number of address bits required to establish the links is considerably reduced in an embodiment of the memory which will now be described with reference to FIG. 6. The embodiment differs from the one shown in FIG. 2 in that the memory locations in which successive code sequences can be stored are defined by a predetermined pattern of candidate links. An example of such a pattern of candidate links is shown in the form of dashed lines between successive memory layers in FIG. 6. In this example, each memory location has two fixed candidate parent locations, but it will be appreciated that (relatively small) numbers other than two are possible. Each subsequent memory layer has half the number of memory locations. In a manner as described above with reference to FIG. 5B, each memory location includes the address 73 of the parent memory location. In this example, one single address bit suffices. Hereinafter, the address 0 will denote the upper one of the two candidate links, the address 1 will denote the lower one.

Not only is the number of address bits reduced in this memory organization, the arrangement is also considerably less complicated. The storage process is the same as the one described above with reference to FIG. 3, but some operational steps are simpler in terms of processing power. Instead of calculating the perceptual relevances of a plurality of code sequences, and selecting the least relevant one (subprogram 37 in FIG. 3), the memory interface circuit in this embodiment only needs to calculate the perceptual relevance of one code sequence, viz. the code sequence stored in the particular memory location for which the link pattern provides a candidate link. For example, upon storing the most significant code sequence D(1,9) in M(1,9), the perceptual relevance of D(2,9) is now to be compared only with the contents of M(2,1).

Figure 7:
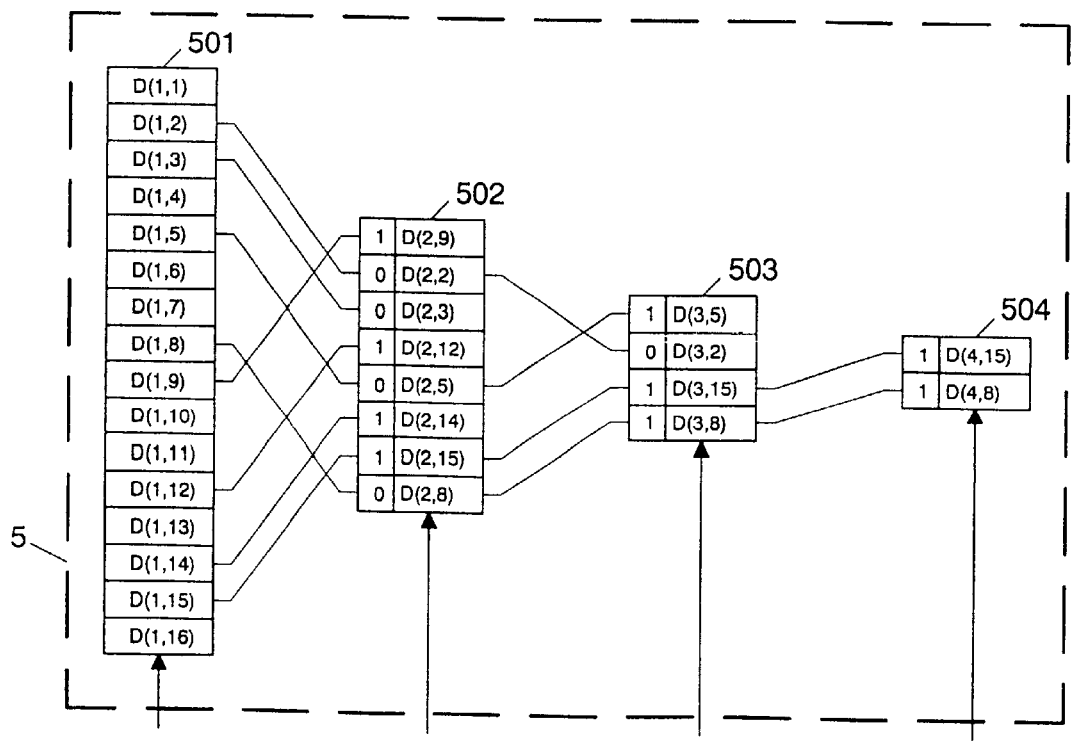
FIG. 7 shows an example of the contents of the memory, which is shown in FIG. 6, after the storage process.

It should be noted that the predetermined link pattern can be defined in many ways. Any two memory locations in a memory layer may constitute parents of a location in the less significant layer. For example, every two adjacent memory locations M(s,i) and M(s,i+1) could be parents of M(s+1,i). In the embodiment, which is shown in FIG. 6, the parents of M(s+1,i) are the locations M(s,i) and M(s,i+½$N_s$). This is particularly advantageous in that each code sequence has to compete with a code sequence of a DCT block which is located far away in the image. Quantization errors are thus evenly distributed in the image. FIG. 7 shows a possible end result of the storage process.

Figure 8:
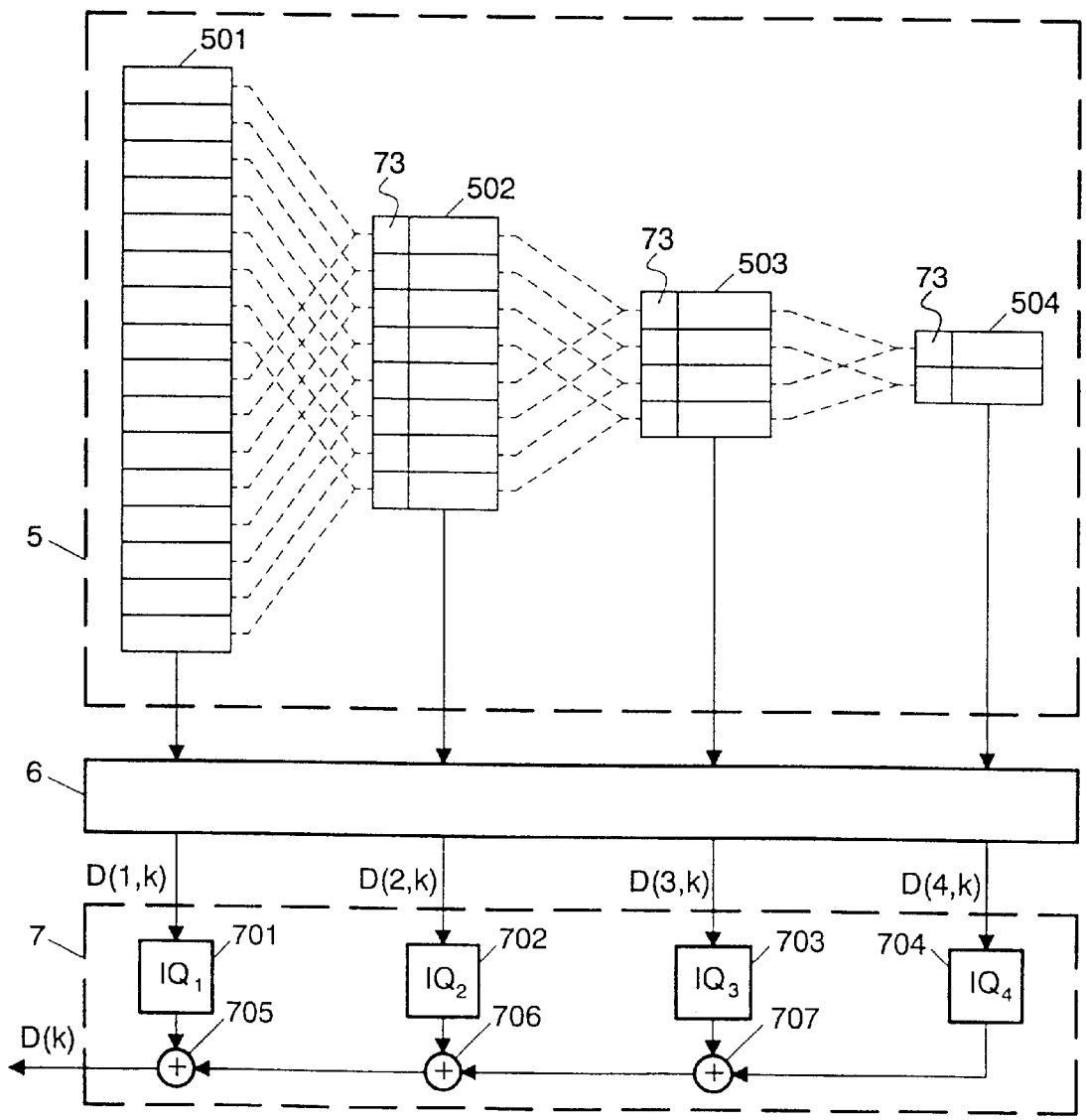
FIG. 8 shows a schematic diagram of an arrangement for retrieving information from a memory in accordance with the invention.

FIG. 8 shows a schematic diagram of an arrangement for retrieving the stored information. The memory 5 is now connected to an inverse quantizing stage 7 via a memory interface circuit 6. The inverse quantizing stage 7 comprises inverse quantizers 701–704 and adders 705–707. The operation of the arrangement can be easily understood in view of the description of the compression process. The first inverse quantizer 701 receives the most significant code sequence D(1,k) of a DCT block D(k) from the first memory layer and dequantizes said code sequence. The result is refined with one or more less significant code sequences D(s,k) from subsequent layers if respective links are present. The DCT blocks are then applied to an inverse discrete cosine transform circuit (not shown).

Figure 9:
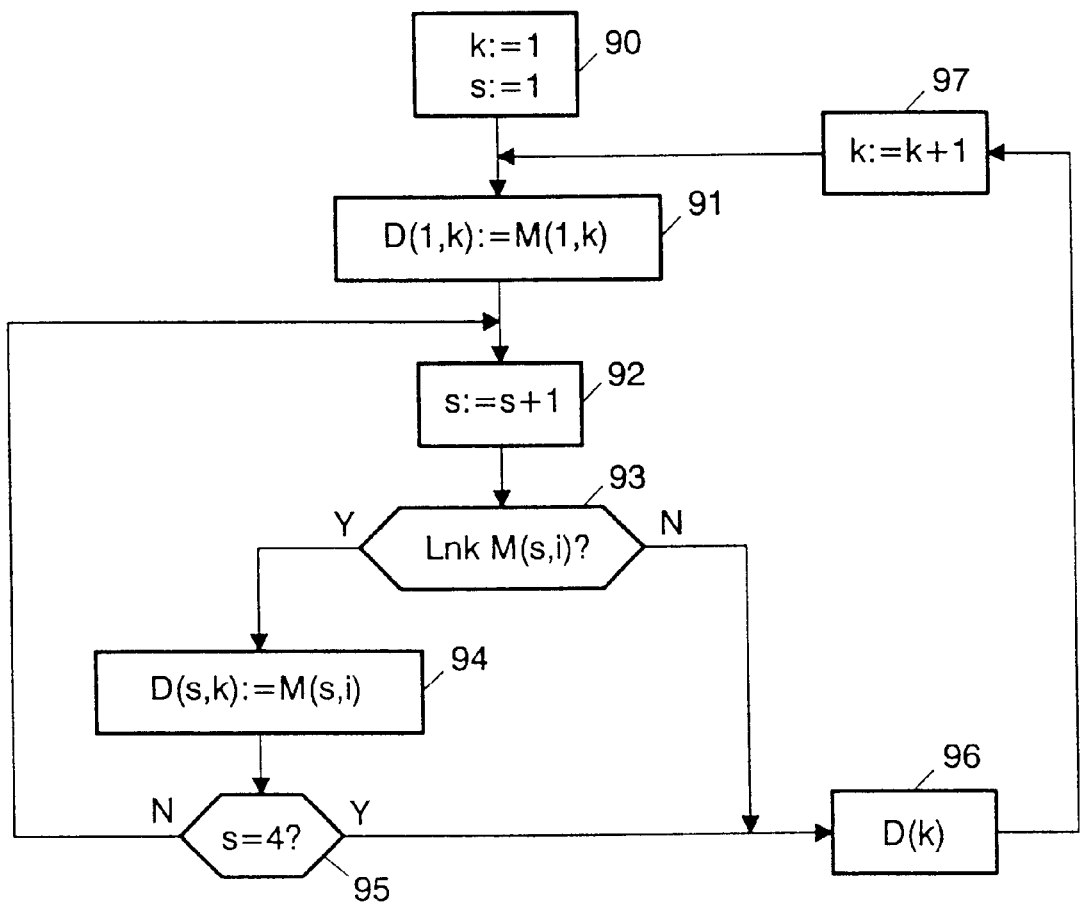
FIG. 9 shows a flow chart of operational steps to illustrate the retrieval process which is carried out by the arrangement shown in FIG. 8.

For completeness, FIG. 9 shows a flow chart of operations carried out by the memory interface circuit 6. In an initial step 90, a variable k denoting a current DCT block D(k) to be retrieved is assigned the value 1, and a variable s representing the significance of the current code sequence D(s,k) of said block is assigned the value 1. In a step 91, the most significant code sequence D(1,k) is read from memory location M(1,k) and applied to inverse quantizer 701.

Subsequently, the variable s is incremented (step 92), and the circuit examines whether there is a link to a memory location M(s,i) in the next less significant memory layer (step 93). If it is found, in the step 93, that there is a link, then the less significant code sequence D(s,k) stored in said linked location is read and applied to the corresponding inverse quantizer (step 94). Unless there are no more layers to be checked (step 95), the program returns to the step 92 to search further code sequences of the same block. If it has been found that there is no link to a next layer, the retrieved code sequences are inverse quantized and added (cf. 6 in FIG. 8) to generate the DCT block D(k) (step 96). The program then increments k (step 97) and returns to the step 91 for retrieving the next DCT block.

The actual implementation of the step 93 of examining whether there is a link from a parent memory location to a subsequent layer depends on which of the embodiments shown in FIGS. 5A and 5B is used to establish the link. In the case of FIG. 5A, the step 93 merely comprises reading the address j which is stored in the parent memory location. In the case of FIG. 5B, the step 93 comprises searching the memory location which holds the address i of the parent memory location. Note that the step 93 is extremely simple if there is a predetermined link pattern as shown in FIG. 8. In this case, the subsequent memory location is known in advance, and it needs to be examined only whether the "chain of data pieces" is continued in the next layer or not.

While the invention has been described with reference to storing a single image in a fixed size memory, it will be appreciated that the, inventive idea can be applied to storing multiple images. Applications thereof are electronic still picture cameras and surveillance systems with flash cards or other media for storing an unknown number of images. Each image is a data item. The first image(s) is (are) stored in (near) lossless quality. As more images are added, the quality of images already stored gradually degrades so as to create memory space for the new images.

In summary, a method of compressing information for storage in a fixed size memory is disclosed. The data items (D(k)) that constitute the information are divided into pieces (D(s,k)) of decreasing significance. For example, the DCT blocks of an image are hierarchically quantized (3). The memory (5) is organized in corresponding memory layers (501–504). Successive memory layers have a decreasing number of memory locations. Every time a data item is applied to the memory, its less significant data pieces will have to compete with corresponding data pieces of previously stored data items. Depending on its contribution to perceptual image quality, the applied data piece is stored or the stored data piece is kept. Links (511–513, 521–522) are stored in the memory to identify the path along which a data item is stored. Eventually, the image is automatically compressed so as to exactly fit in the memory.

What is claimed is:

1. A method of storing data items in a memory, comprising the steps of:
    dividing (3) each data item (D(k)) into successive data pieces (D(s,k)) of decreasing significance,
    storing said successive data pieces in respective successive layers (501–504) of said memory, each layer comprising memory locations (M(s,i)) for storing data pieces of a given significance,
characterized in that the successive memory layers have a decreasing number ($N_1$–$N_4$) of memory locations, the method further comprising the following steps:
    when a data piece is applied to a candidate memory location (M(s,i)) in which a data piece has previously been stored, comparing (37) the perceptual relevance (R(s,i)) of at least said stored data piece with the perceptual relevance (R(s,k)) of at least said applied data piece, in accordance with a predetermined criterion (38),
    if the perceptual relevance of the stored data piece is larger, refraining from storing the applied data piece in said candidate memory location,
    if the perceptual relevance of the applied data piece is larger,
        a) replacing (39) the stored data piece in said candidate memory location by the applied data piece, and
        b) storing (40) link data (72;73) in the memory to link said candidate memory location to the parent memory location in which the higher significant data piece of the same data item is stored.

2. A method as claimed in claim 1, wherein said replacing step includes replacing (41–43) the data pieces stored in subsequent memory locations linked to said candidate memory location by respective less significant data pieces of the applied data item.

3. A method as claimed in claim 1, wherein said comparison step comprises comparing the perceptual relevance of the stored data piece and subsequent data pieces stored in subsequent memory locations linked to said candidate memory location with the perceptual relevance of the applied data piece and the corresponding subsequent data pieces of the applied data item.

4. A method as claimed in claim 1, wherein groups of memory locations of a layer share a candidate memory location in the subsequent memory layer.

5. A method as claimed in claim 4, wherein the memory locations of a group are interleaved with memory locations of other groups.

6. A method as claimed in claim 4, wherein each group comprises two memory locations.

7. A method as claimed in claim 1, wherein said linking step comprises storing the address (72) of the candidate memory location in the parent memory location.

8. A method as claimed in claim 1, wherein said linking step comprises storing the address (73) of the parent memory location in the candidate memory location.

9. A method as claimed in claim 1, wherein said data items are sub-images of an image, the step of dividing each data item into successive data pieces of decreasing significance comprising the step of hierarchically quantizing said sub-images.

10. A method of reading data items from a memory, wherein successive data pieces (D(s,k)) of said data items (D(k)) in a decreasing order of significance are stored in respective successive layers (501–504) of said memory (5) having a decreasing number of memory locations, the method comprising the steps of:
    a) reading (91,94) a data piece from a parent memory location in a respective memory layer;
    b) reading link data (72;73) stored in the memory to identify a memory location in the subsequent layer where a subsequent data piece of the same data item is stored; and
    c) repeating steps a) and b) as long as a link from the parent memory location to a memory location in the subsequent layer is identified;
    d) constructing each data item from the subsequently read data pieces.

11. A method as claimed in claim 10, wherein said step of reading link data comprises reading, from the parent memory location, the address (72) of the memory location in the subsequent layer.

12. A method as claimed in claim 10, wherein said step of reading link data comprises determining the memory location in the subsequent layer in which the address (73) of the parent memory location is stored.

13. A method as claimed in claim 10, wherein said data pieces in decreasing order of significance are hierarchically quantized sub-images of an image.

14. An arrangement for storing data items in a memory (5), comprising:
   means (3) for dividing each data item (D(k)) into successive data pieces (D(s,k)) of decreasing significance,
   memory interface means (4) for storing said successive data pieces in respective successive layers (501–504) of said memory, each layer comprising memory locations (M(s,i)) for storing data pieces of a given significance, characterized in that the successive memory layers have a decreasing number ($N_1$–$N_4$) of memory locations, the memory interface means being arranged as follows:
   when a data piece is applied to a candidate memory location (M(s,i)) in which a data piece has previously been stored, the perceptual relevance (R(s,i)) of at least said stored data piece compared (37) with the perceptual relevance (R(s,k)) of at least said applied data piece, in accordance with a predetermined criterion (38),
   if the perceptual relevance of the stored data piece is larger, storing the applied data piece in said candidate memory location is refrained from,
   if the perceptual relevance of the applied data piece is larger,
      a) the stored data piece in said candidate memory location is replaced (39) by the applied data piece, and
      b) link data (72;73) are stored (40) in the memory to link said candidate memory location to the parent memory location in which the higher significant data piece of the same data item is stored.

15. An arrangement for reading data items from a memory, wherein successive data pieces (D(s,k)) of said data items (D(k)) in a decreasing order of significance are stored in respective successive layers (501–504) of said memory (5) having a decreasing number of memory locations, comprising memory interface means (6) for reading said successive data pieces from successive memory layers; and means (71) for constructing each data item from said successive data pieces; the memory interface means (6) being arranged to:
   a) read (91,94) a data piece from a parent memory location in a respective memory layer;
   b) read link data (72;73) stored in the memory to identify a memory location in the subsequent layer where a subsequent data piece of the same data item is stored; and
   c) repeat steps a) and b) as long as a link from the parent memory location to a memory location in the subsequent layer is identified.

16. A storage medium (5) having stored thereon data items (D(k)), wherein successive data pieces (D(s,k)) of said data items are arranged in a decreasing order of significance, the memory being organized in successive layers (501–504) having a decreasing number ($N_1$–$N_4$) of memory locations for storing data pieces of a given significance and comprising link data sections for storing link data (72;73) identifying a memory location in the subsequent layer where a subsequent data piece of the same data item is stored.

* * * * *